United States Patent [19]
Reifel et al.

[11] Patent Number: 5,225,897
[45] Date of Patent: Jul. 6, 1993

[54] MOLDED PACKAGE FOR SEMICONDUCTOR DEVICES WITH LEADFRAME LOCKING STRUCTURE

[75] Inventors: Harry C. Reifel, Topsfield; Angelo R. Santamaria, Jr., Winchester; Herman V. D. Soerewyn, Peabody, all of Mass.

[73] Assignee: Unitrode Corporation, Billerica, Mass.

[21] Appl. No.: 771,327

[22] Filed: Oct. 2, 1991

[51] Int. Cl.[5] .................... H01L 23/28; H01L 27/02; H01L 23/36

[52] U.S. Cl. .................... 257/787; 257/678; 257/734; 257/712

[58] Field of Search .................... 357/72, 74, 80, 81, 357/68

[56] References Cited

U.S. PATENT DOCUMENTS

| | | | |
|---|---|---|---|
| 3,693,251 | 9/1972 | Jaccodine | 357/73 |
| 4,417,298 | 11/1983 | Nakata et al. | 357/72 |
| 4,510,677 | 4/1985 | Collumeau | 357/69 |
| 4,538,168 | 8/1985 | Van Dyk Soerewyn | 357/72 |
| 4,583,807 | 4/1986 | Kaufman et al. | 339/125 R |
| 4,630,172 | 12/1986 | Stenerson et al. | 361/386 |
| 4,632,798 | 12/1986 | Eickman et al. | 264/272.17 |
| 4,641,426 | 2/1987 | Hartman et al. | 29/839 |
| 4,642,889 | 2/1987 | Grabbe | 29/840 |
| 4,707,763 | 11/1987 | Kudo | 361/386 |
| 4,719,250 | 1/1988 | Eickman et al. | 523/212 |
| 4,741,507 | 5/1988 | Baird | 249/91 |
| 4,750,092 | 6/1988 | Werther | 361/400 |
| 4,777,564 | 10/1988 | Derfiny et al. | 361/405 |
| 4,862,245 | 8/1989 | Pashby et al. | 357/70 |
| 4,872,825 | 10/1989 | Ross | 425/117 |
| 4,881,885 | 11/1989 | Kovac et al. | 425/121 |
| 4,884,335 | 12/1989 | McCoy et al. | 29/839 |
| 4,925,024 | 5/1990 | Ellenberger et al. | 206/328 |
| 4,931,906 | 6/1990 | Reifel et al. | 361/386 |
| 4,945,398 | 7/1990 | Kurita et al. | 357/71 R |
| 4,959,751 | 9/1990 | Hearn et al. | 361/406 |
| 4,961,107 | 10/1990 | Geist et al. | 357/81 |
| 5,007,844 | 4/1991 | Mason et al. | 439/68 |

FOREIGN PATENT DOCUMENTS

| | | |
|---|---|---|
| 58-56359 | 4/1983 | Japan . |
| 59-45534 | 3/1984 | Japan . |
| 60-21550 | 2/1985 | Japan . |
| 60-138944 | 7/1985 | Japan . |
| 2123610 | 2/1984 | United Kingdom . |

OTHER PUBLICATIONS

Berger et al., "circuit package", Western Electric Technical digest, No. 46, Apr./1977, p. 3.

Primary Examiner—Eugene R. LaRoche
Assistant Examiner—Viet Q. Nguyen
Attorney, Agent, or Firm—Weingarten, Schurgin, Gagnebin & Hayes

[57] ABSTRACT

A molded package with a leadframe locking structure is shown. A lower leadframe consists of a frame member, a connecting element extending therefrom, a mounting member at the distal end of the connecting element, and at least one side element projecting from the mounting member. Electrical connection is made between the mounting member and a semiconductor device. An upper leadframe consists of a frame member and an extending lead element which makes electrical contact with an upper surface of the semiconductor device. There is at least one side element bent up to a predetermined angle relative to the mounting member so that an encapsulant will be locked in place, minimizing the possibility of semiconductor contamination via boundaries between the encapsulant and the leadframes. The encapsulant, such as plastic or epoxy, is transfer or injection molded over the lead element, over the semiconductor device, about the side element, and on top of the mounting member to form the completed package. The leadframes are then removed, leaving a tab extending from the mounting member and a portion of the lead element to serve as electrical leads to the semiconductor device inside.

11 Claims, 5 Drawing Sheets

MOLDED PACKAGE FOR SEMICONDUCTOR DEVICES WITH LEADFRAME LOCKING STRUCTURE

FIELD OF THE INVENTION

This invention relates generally to packages for containing semiconductor devices, and more specifically to molded semiconductor packages with integral locking means.

BACKGROUND OF THE INVENTION

Molded packages have the potential to provide less expensive enclosures for semiconductor devices, to be readily prepared using automated high volume manufacturing techniques, and to provide a high degree of thermal dissipation and protection against the possibility of contaminants entering the package through microcracks along terminal leads. However, current molded semiconductor packages do not satisfactorily achieve these advantages.

Ellenberger et al., U.S. Pat. No. 4,925,024, discloses alternating layers of conducting and insulating materials to form a package with a sealed, internal cavity for housing an integrated circuit. Drawbacks of this design include the use of a ceramic layer between the semiconductor device and the metalized base. Vias, or metallic leads extending through this ceramic layer, provide a lesser level of thermal dissipation than having the device mounted directly on a metallic base. Additionally, the package's multiple conducting layer and insulating layer interfaces increase the risk of the package developing microcracks along these boundaries as a result of thermal fluctuations. Furthermore, such a design necessarily requires more complicated assembly due to the multiple layers.

A similar package is disclosed in Reifel et al., U.S. Pat. No 4,931,906. Even though the insulating and conducting materials are chosen to have similar coefficients of thermal expansion, the multiplicity of layer interfaces still poses a higher risk of cracking than a design with only one conductor to insulator boundary. Since the center of this package is hollow, a crack along one of its broad conducting tabs can allow a contaminant to travel the short distance to the cavity and the semiconductor device.

Van Dyk Soerewyn, U.S. Pat. No. 4,538,168, discloses a package for a high power semiconductor device comprising an extruded thermally and electrically conducting housing carrying one or more semiconductor die assemblies in a molded encapsulant. Whereas this design minimizes the number of insulator to conductor interfaces, its manufacture is still involved; the housing must be extruded to the designated shape, encapsulant anchoring flanges and/or grooves must be formed, and the housing must be cut to the appropriate size. After installation of the semiconductor device into the formed housing, the encapsulant is inserted.

An easily manufactured design which locks a semiconductor device encapsulant to a metallic base is lacking in the current art.

SUMMARY OF THE INVENTION

In accordance with the present invention, a molded package with a leadframe locking structure is disclosed. A lower leadframe consists of a frame member, a connecting element extending therefrom, a mounting member at the distal end of the connecting element, and at least one side element projecting from the mounting member. Electrical connection is made between the mounting member and a semiconductor device. An upper leadframe consists of a frame member and an extending lead element which makes electrical contact with an upper surface of the semiconductor device. The at least one side element is then bent up to a predetermined angle relative to the mounting member. An encapsulant, such as plastic or epoxy, is transfer or injection molded or potted over the lead element, over the semiconductor device, about the side element, and on top of the mounting member to form the completed package. The leadframe tie bars are then removed, leaving a tab extending from the mounting member and a portion of the lead element to serve as electrical leads to the semiconductor device inside.

One benefit of the present invention is the ease of manufacture. The leadframes are etched or stamped, and the side elements are manipulated using dies, both processes being well-known in the art. The use of an encapsulant reduces the number of mechanical boundaries to two, the encapsulant to the mounting member and to the lead element. In surface mount applications, the lead element can be bent downward to form an electrical contact surface in the same plane as the mounting member. All of these manufacturing processes can be performed while the package is still on the upper and lower frame members, further simplifying the preparation of the package.

The package also provides decreased opportunity for semiconductor device contamination. The side element acts as a mechanical lock, preventing the encapsulant from pulling away from the mounting member. Further, as noted there are only two conductor to insulator boundaries and the semiconductor device is completely encapsulated in material such as plastic or epoxy. The boundary is secured by brazing or any method known in the art.

Thermal conductivity is also enhanced. The semiconductor device is mounted directly on the metallic base, which then serves as a heat sink as well as an electrical contact. Heat dissipation is also achieved by thermal radiation from the bent side element. In surface mount applications, thermal conduction and package adhesion to the circuit board is further enhanced if fillets of solder are drawn up the side element.

Additionally, in surface mount applications, the base of the package is substantially metallic, thus removing the problem of flux or other foreign matter being trapped between the package and a circuit board.

DESCRIPTION OF THE DRAWINGS

Other features, objects and benefits of the invention can be more clearly understood with reference to the following description of an illustrative embodiment, and to the drawings, in which.

DETAILED DESCRIPTION

Figure 1:
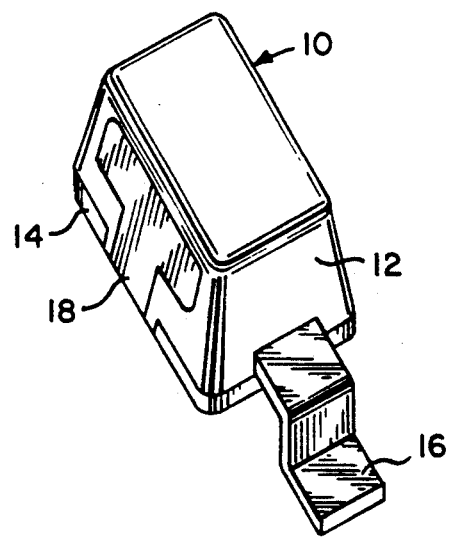
FIG. 1 is a perspective view of a molded package for semiconductor devices with a leadframe locking structure in accordance with the invention.

Referring now to FIG. 1, a molded package 10 for semiconductor devices with a leadframe locking structure is shown. The molded package 10 comprises a molded encapsulant 12, a mounting member 14, a lead element 16, and at least one side element 18 which applies a restraining force on the molded encapsulant 12 when bent to a position roughly at right angles to the mounting member 14 prior to the application of the encapsulant.

Figure 2:
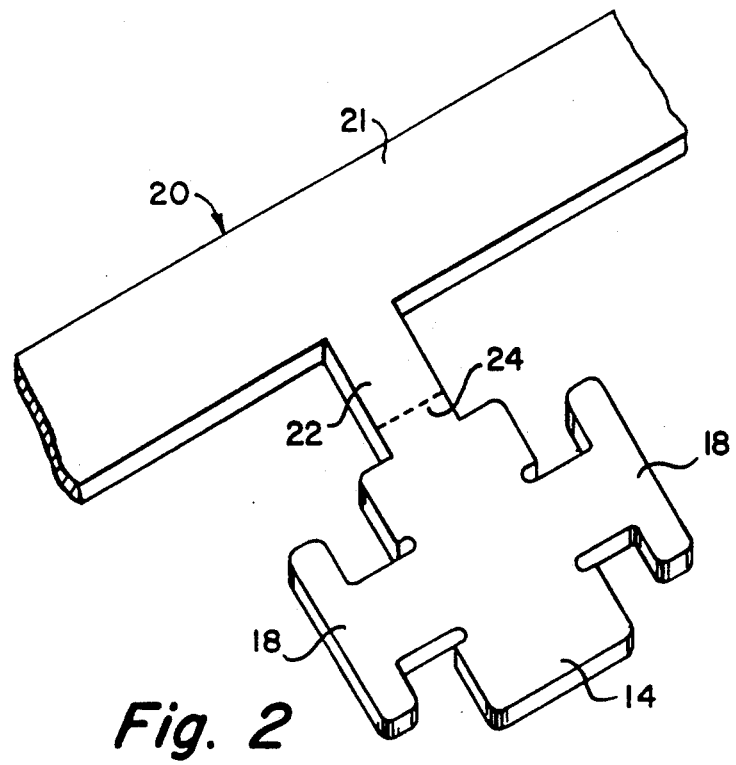
FIG. 2 is a perspective view of a representative portion of a lower leadframe and its constituent elements.
Figure 3A:
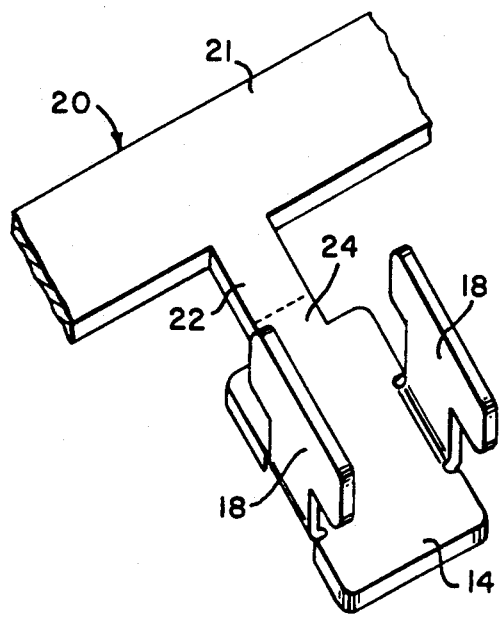
FIG. 3A is a perspective view of the lower leadframe in which two side elements have been bent up to a predetermined angle relative to the lower leadframe.
Figure 3D:
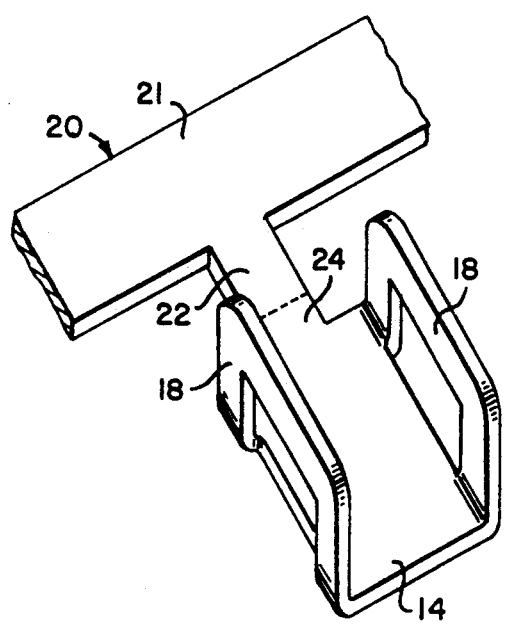
FIG. 3D is a perspective view of the lower leadframe in which the two side elements have cut-out sections.
Figure 3B:
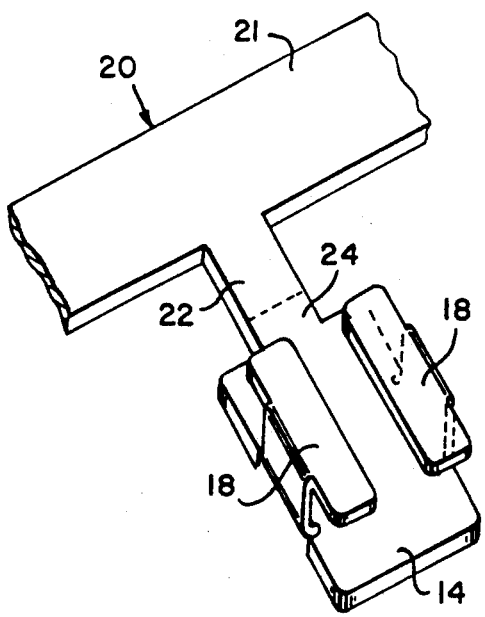
FIGS. 3B and 3C are perspective views of the lower leadframe in which two side elements have multiple bends.
Figure 3C:
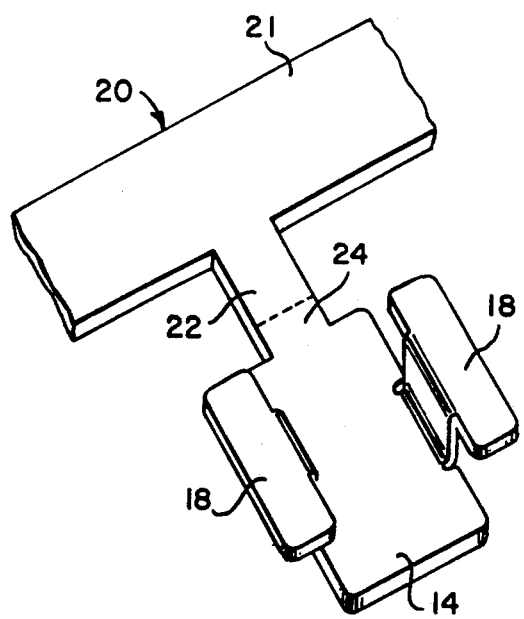

A lower leadframe 20 is formed by stamping or etching processes known in the art, and is illustrated in FIG. 2. The lower leadframe 20 includes a frame member 21 and a connecting or tie bar element 22, both being severable once the molded package 10 is complete, a tab 24 used as an electrical contact, a mounting member 14 on which a semiconductor device 26 is attached, and two side elements 18. The mounting member 14 can act as a mechanical base, an electrical contact, and a heat sink for the molded package 10. Two side elements 18 are shown substantially coplanar with the mounting member 14. FIG. 3 depicts the lower leadframe 20 of FIG. 2 with the side elements 18 bent into a position compatible with the preferred shape of the molded encapsulant 12. In order to accommodate a wide variety of circuit board architecture possibilities, the molded package 10 may be manufactured in varying sizes and shapes. In the preferred embodiment, both of the side elements 18 are bent or folded at roughly right angles relative to the plane of the mounting element 14. However, either or both of the side elements 18 may be bent at any angle consistent with the deformation limits of the material being bent. Additionally, the side elements 18 may be bent more than one time as depicted in FIG. 3a which illustrates a second inward bend, and FIG. 3b which depicts an additional outward bend. Furthermore, the side elements 18 may vary in size and shape such as illustrated in FIG. 3c wherein the side elements have punched or cut-out sections.

Figure 4A:
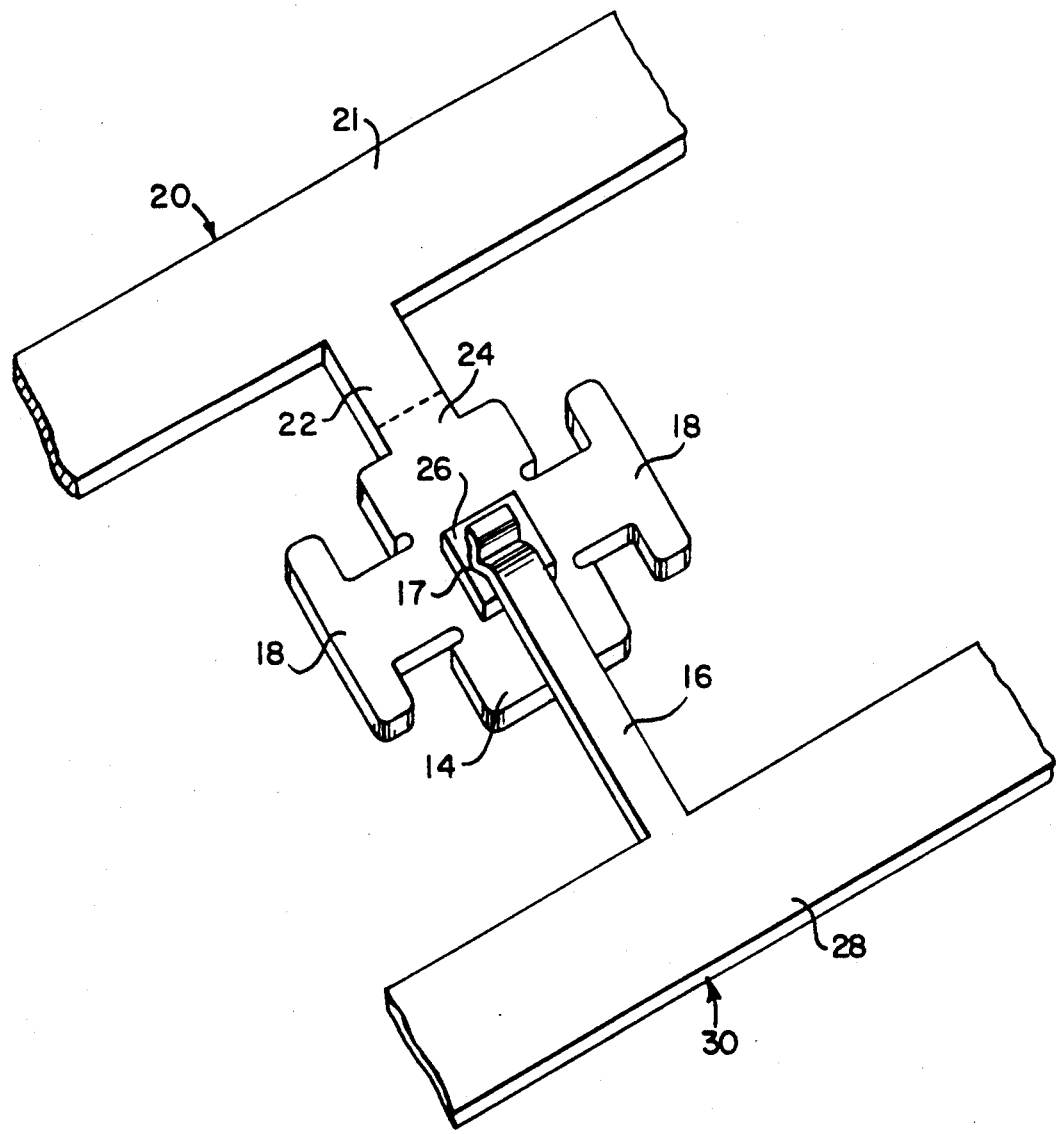
FIG. 4A is a perspective view of a lead element of an upper leadframe positioned atop a semiconductor device, which is attached to a mounting member of the lower leadframe.
Figure 4B:
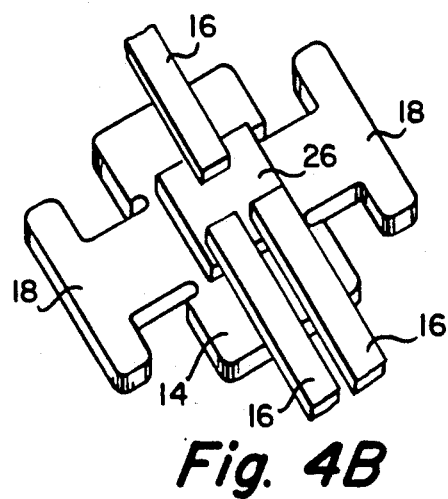
FIG. 4B is a perspective view of multiple lead elements of an upper leadframe positioned atop a semiconductor device, which is attached to a mounting member of the lower leadframe.
Figure 4C:
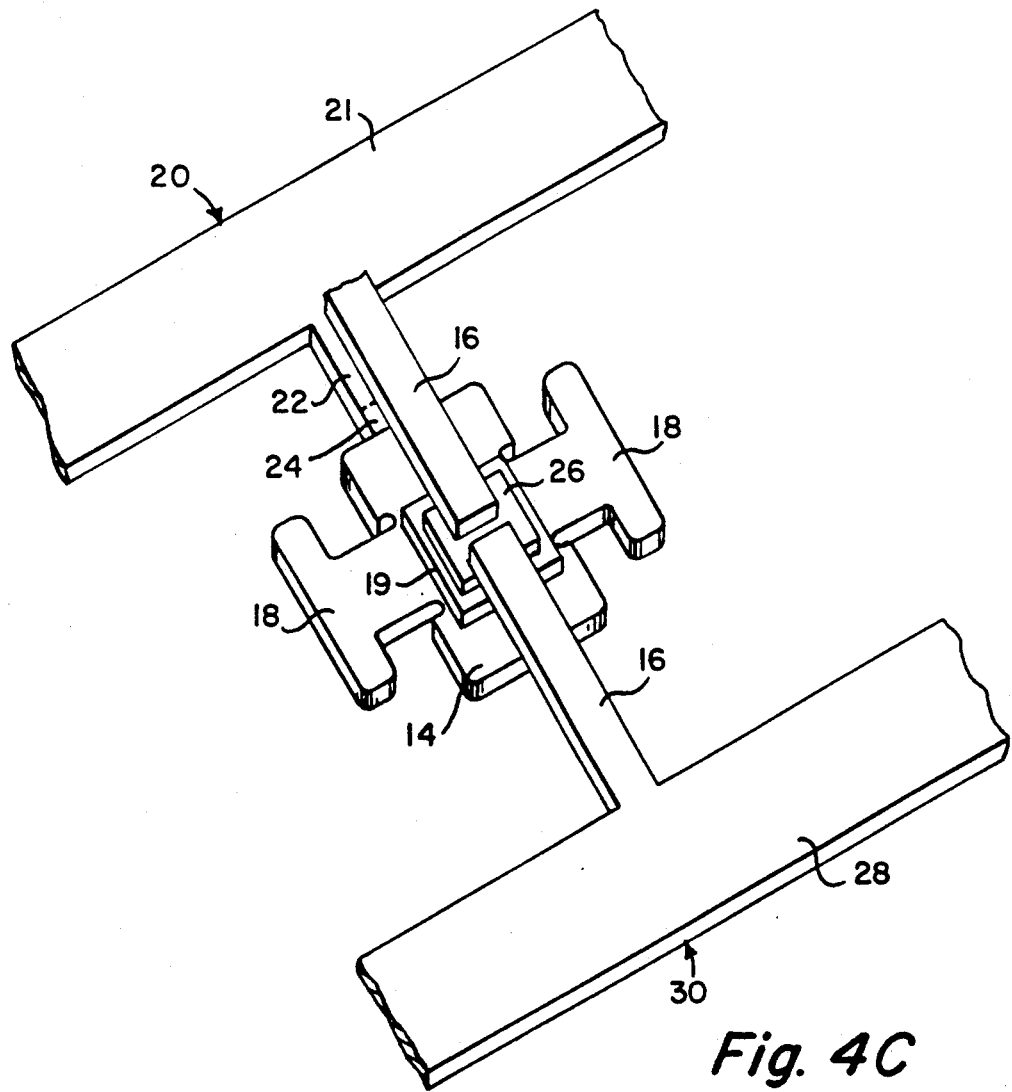
FIG. 4C is a perspective view of multiple lead elements of an upper leadframe positioned atop a semiconductor device isolated from the lower leadframe by ceramic material.

Referring to FIG. 4, the same elements of FIG. 2 are shown. Additionally, a portion of an upper leadframe 30, comprising an upper frame member 28, a lead element 16, and a contact area 17, is shown positioned over the mounting member 14. Between them and in electrical contact with each is a semiconductor device 26. Should multiple leads 16 be desired, their incorporation is facilitated by this fabrication technique. FIG. 4a illustrates the positioning of three leads 16 extending from the upper leadframe and in contact with a semiconductor device 26. Another variation of the multiple lead configuration is shown in FIG. 4b, wherein two leads 16 are in contact with a semiconductor device 26 isolated from the mounting member 14 by a suitably sized piece of ceramic material 19.

Figure 5:
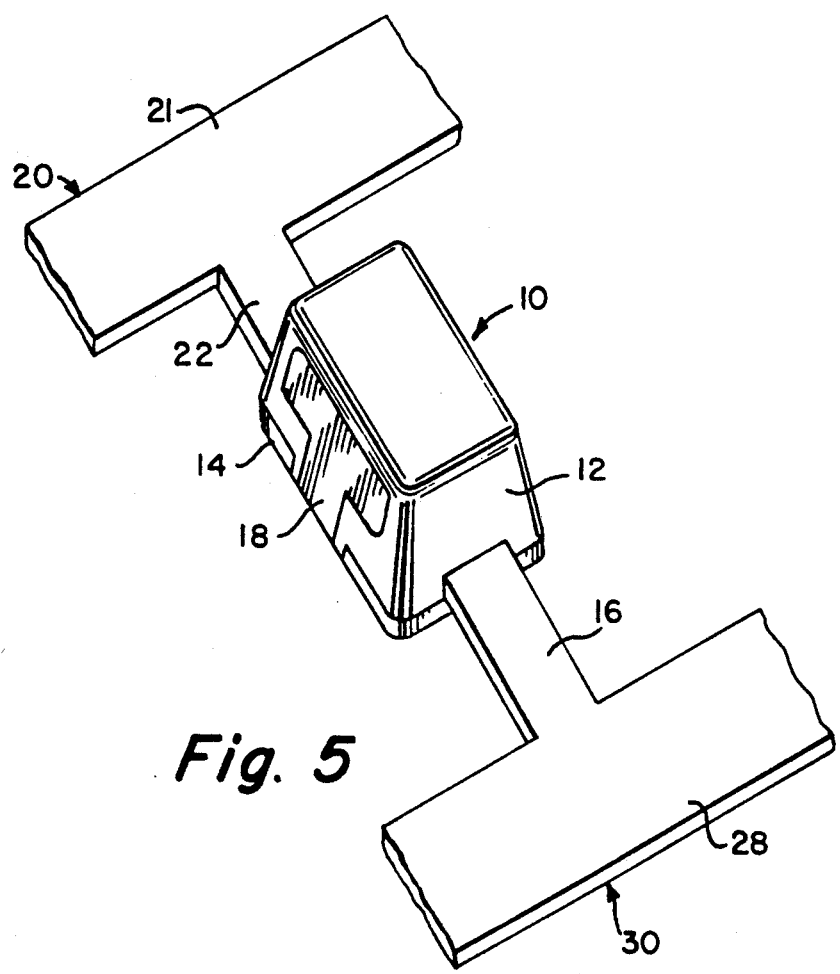
FIG. 5 is a perspective view of the lead element, the semiconductor device, the mounting member, and the bent up side elements within a molded encapsulant.

In FIG. 5, a molded encapsulant 12 has been formed over the lead element 16, the semiconductor device 26, and onto the mounting member 14. Also, molded encapsulant 12 has been formed around the side elements 18, which are shown in the bent up position of FIG. 3 to provide a locking action. This action decreases the possibility of separation of the molded encapsulant 12 from the mounting member 14.

Figure 6:
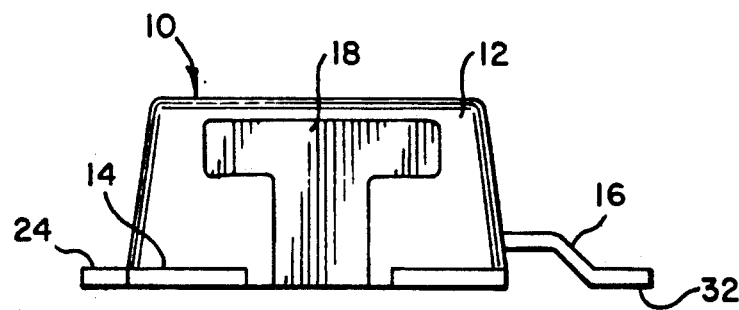
FIG. 6 is a side view of the molded package of FIG. 1.

To complete the molded package 10, as shown in FIG. 6, frame members 21 and 28 are removed, and the remaining lead element 16 is bent downward to provide a contact surface 32 substantially coplanar with the mounting member 14 in order to facilitate surface mounting of the molded package 10. The connecting element 22 has been cut away so as to leave a tab 24 which may be used for making an electrical connection to the semiconductor device 26 inside the molded encapsulant 12. Alternatively, tab 24 may be used as a test point in electrical connection to the semiconductor device 26 inside the molded encapsulant 12.

These and other examples of the invention illustrated above are intended by way of example and the actual scope of the invention is to be determined from the following claims.

We claim:

1. A semiconductor package comprising:

a conductive mounting platform for a semiconductor device comprising at least one encapsulant engaging member, an interior conductive surface and an exterior conductive surface;

a semiconductor device having a first electrical contact and a second electrical contact, wherein said semiconductor device is positioned on said interior conductive surface of said conductive mounting platform such that said first electrical contact is in conductive contact with said interior conductive surface, and said second electrical contact is in conductive contact with at least one conductive lead;

an encapsulant anchored to said conductive mounting platform by said at least one encapsulant engaging member, said encapsulant forming a shell-like covering over said semiconductor device, wherein said exterior conductive surface and said at least one encapsulant engaging member are exposed for heat dissipation, and wherein said encapsulant engaging member comprises an exterior wall portion of said encapsulant;

said at least one conductive lead comprising a first end and a second end, said first end in contact with said second electrical contact of said semiconductor device, and said second end exterior to said encapsulant;

said semiconductor package manufactured by a process comprising the steps of:

forming a lower leadframe comprising said conductive mounting platform for said semiconductor device, said conductive mounting platform extending from a side of said lower leadframe toward a side of an upper leadframe;

forming an upper leadframe comprising said at least one conductive lead, said at least one conductive lead extending from said side of said upper leadframe toward said side of said lower leadframe;

attaching said semiconductor device to said conductive mounting platform so that a conductive connection is made;

positioning said contact surface of said at least one conductive lead of said upper leadframe on said second electrical contact of said semiconductor device;

bending said at least one encapsulant engaging member to a predetermined angle with respect to a plane defined by said upper conductive surface of said conductive mounting platform;

forming said encapsulant over said contact surface of said at least one conductive lead, over said semiconductor device and around said at least one encapsulant engaging member, thereby sealing said semiconductor device within a protective shell, and leaving said exterior conductive surface and said at least one conductive lead exposed for electrical connection, and said exterior conductive surface and said at least one encapsulant engaging member exposed for heat dissipation, said at least one encapsulant engaging member comprising said exterior wall portion of said encapsulant; and separating said conductive mounting platform from said lower leadframe and separating said at least one conductive lead from said upper leadframe.

2. The semiconductor package of claim 1, wherein said at least one encapsulant engaging member secures said encapsulant onto said conductive mounting platform.

3. The semiconductor package of claim 1, further comprising a tab extending from said conductive mounting platform.

4. The semiconductor package of claim 1, further comprising an isolation means, wherein said conductive mounting platform and said semiconductor device are electrically isolated from each other.

5. The semiconductor package of claim 1, wherein said at least one conductive lead is bent downward, with respect to said conductive mounting platform, prior to said step of separating said conductive mounting platform from said lower leadframe and separating said at least one conductive lead from said upper leadframe to form a contact surface on said second end exterior to said encapsulant.

6. The semiconductor package of claim 1, wherein said lower leadframe and said upper leadframe are formed by stamping.

7. The semiconductor package of claim 1, wherein said lower leadframe and said upper leadframe are formed by etching.

8. The semiconductor package of claim 1, wherein said encapsulant is shaped by transfer molding.

9. The semiconductor package of claim 1, wherein said encapsulant is shaped by injection molding.

10. The semiconductor package of claim 1, wherein a boundary between said conductive mounting platform and said encapsulant is brazed.

11. The semiconductor package of claim 1, wherein said encapsulant is potted.

* * * * *